US009575115B2

(12) United States Patent
Chadwick et al.

(10) Patent No.: US 9,575,115 B2
(45) Date of Patent: Feb. 21, 2017

(54) METHODOLOGY OF GRADING RELIABILITY AND PERFORMANCE OF CHIPS ACROSS WAFER

(71) Applicant: GLOBALFOUNDRIES INC., Grand Cayman OT (KY)

(72) Inventors: Nathaniel R. Chadwick, Burlington, VT (US); James P. Di Sarro, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Kirk D. Peterson, Jericho, VT (US); Andrew A. Turner, Milton, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1144 days.

(21) Appl. No.: 13/649,699

(22) Filed: Oct. 11, 2012

(65) Prior Publication Data
US 2014/0107822 A1  Apr. 17, 2014

(51) Int. Cl.
*G01R 31/28* (2006.01)
*H01L 21/66* (2006.01)

(52) U.S. Cl.
CPC ....... *G01R 31/2872* (2013.01); *G01R 31/2831* (2013.01); *G01R 31/2894* (2013.01); *H01L 22/14* (2013.01); *H01L 22/20* (2013.01)

(58) Field of Classification Search
CPC ............ G01R 31/2894; G01R 31/2872; G01R 31/2831; H01L 22/20; H01L 22/14
See application file for complete search history.

(56) References Cited

U.S. PATENT DOCUMENTS 5,219,765 A    6/1993  Yoshida et al.
5,726,074 A *  3/1998  Yabe ................... H01L 21/6836
                                              257/E21.525
(Continued)

FOREIGN PATENT DOCUMENTS

JP    61-039541       2/1986
JP    03161942 A  *  7/1991
(Continued)

*Primary Examiner* — Crystal J Barnes-Bullock
(74) *Attorney, Agent, or Firm* — Gibb & Riley, LLC; Michael J. LeStrange, Esq.

(57) ABSTRACT

A system and method sorts integrated circuit devices. Integrated circuit devices are manufactured on a wafer according to an integrated circuit design using manufacturing equipment. The design produces integrated circuit devices that are identically designed and perform differently based on manufacturing process variations. The integrated circuit devices are for use in a range of environmental conditions, when placed in service. Testing is performed on the integrated circuit devices. Environmental maximums are individually predicted for each device. The environmental maximums comprise ones of the environmental conditions that must not be exceeded for each device to perform above a given failure rate. Each integrated circuit device is assigned at least one of a plurality of grades based on the environmental maximums predicted for each device. The integrated circuit devices are provided to different forms of service having different ones of the environmental conditions based on the grades assigned to each device.

19 Claims, 13 Drawing Sheets

(56) References Cited

U.S. PATENT DOCUMENTS

| | | | |
|---|---|---|---|
| 5,838,951 A | 11/1998 | Song | |
| 6,140,151 A * | 10/2000 | Akram | H01L 21/6836 438/113 |
| 6,265,232 B1 | 7/2001 | Simmons | |
| 6,477,685 B1 | 11/2002 | Lovelace | |
| 6,483,330 B1 * | 11/2002 | Kline | G01R 31/2831 324/750.03 |
| 6,537,831 B1 * | 3/2003 | Kline | H01L 22/20 257/E21.525 |
| 6,589,801 B1 * | 7/2003 | Yoon | H01L 22/20 257/E21.525 |
| 6,759,741 B2 * | 7/2004 | Kline | H01L 22/20 257/727 |
| 6,780,734 B2 * | 8/2004 | Kim | H01L 21/6838 257/723 |
| 6,789,238 B2 * | 9/2004 | Swanson | H01L 22/22 257/E21.526 |
| 6,822,469 B1 * | 11/2004 | Kline | G01R 1/0408 324/750.05 |
| 6,927,593 B2 * | 8/2005 | Kline | G01R 1/0408 324/756.05 |
| 6,976,998 B2 | 12/2005 | Rizzo et al. | |
| 7,241,635 B1 | 7/2007 | Osann, Jr. | |
| 7,653,450 B2 * | 1/2010 | Burda | G06Q 10/06 700/100 |
| 7,786,877 B2 | 8/2010 | Hou | |
| 7,890,893 B2 | 2/2011 | Bolam et al. | |
| 8,095,230 B2 | 1/2012 | Ouyang et al. | |
| 8,097,474 B2 | 1/2012 | Anemikos et al. | |
| 8,440,488 B2 * | 5/2013 | Tu | H01L 27/14618 257/E27.001 |
| 2003/0143539 A1 | 7/2003 | Bertucci et al. | |
| 2005/0034087 A1 | 2/2005 | Hamlin et al. | |
| 2006/0267577 A1 * | 11/2006 | Erez | G01R 31/2894 324/750.15 |
| 2007/0134692 A1 | 6/2007 | Valmeekam et al. | |
| 2008/0057677 A1 | 3/2008 | Charles et al. | |
| 2009/0299679 A1 | 12/2009 | Desineni et al. | |
| 2010/0044858 A1 | 2/2010 | Cohn et al. | |
| 2010/0202183 A1 | 8/2010 | Kurjanowicz | |
| 2011/0020317 A1 | 1/2011 | Miller et al. | |
| 2011/0078775 A1 | 3/2011 | Yan | |
| 2012/0022687 A1 | 1/2012 | Chen et al. | |

FOREIGN PATENT DOCUMENTS

| | | |
|---|---|---|
| JP | 09-050945 | 2/1997 |
| TW | 557528 B | 10/2003 |

\* cited by examiner

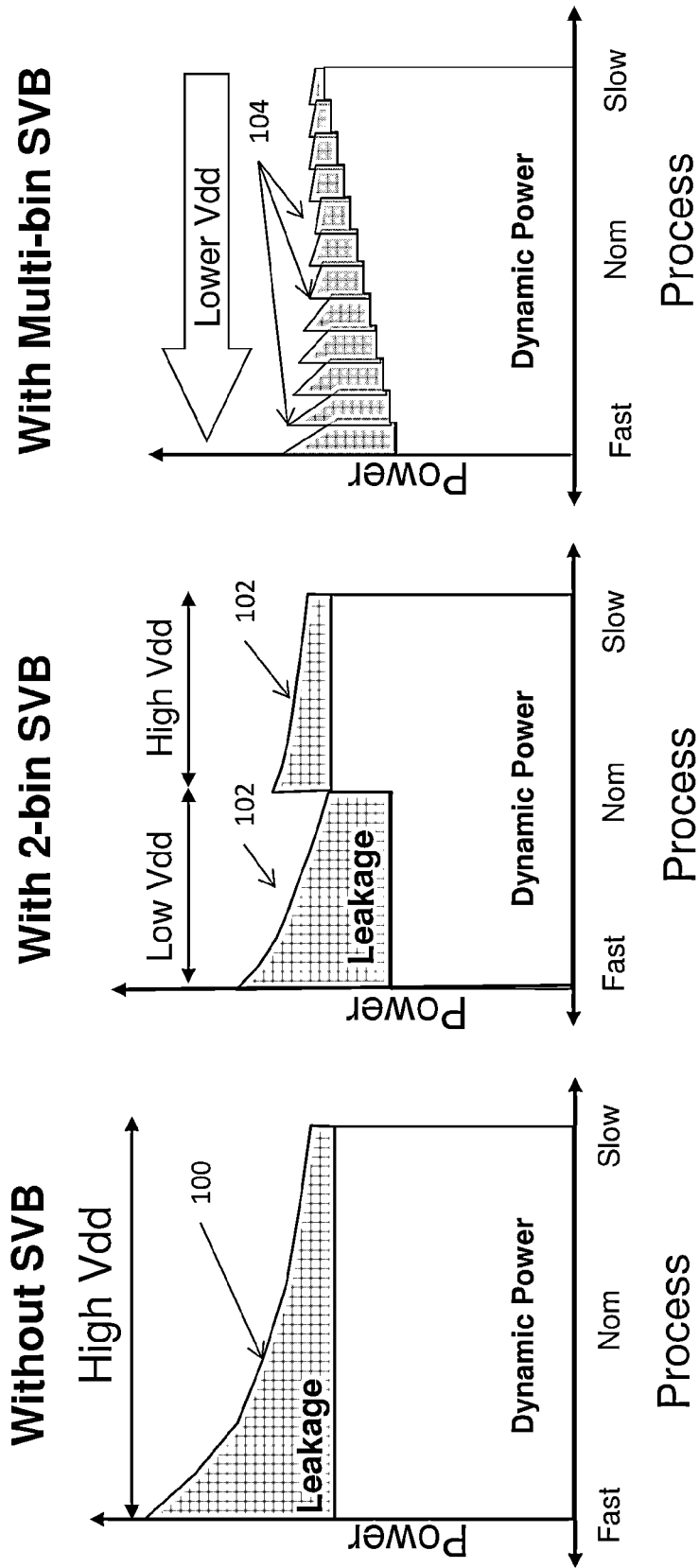

|  | .95 V | 1.0 V | 1.05 V | 1.1 V |
|---|---|---|---|---|
| 70° C |  |  |  | C1, C2 |
| 80° C |  | C1 | C1 | C1, C2, C3 |
| 90° C |  | C1, C2 | C1, C2 | C2, C3, C4 |
| 100° C | C2 | C1, C2, C3 | C1, C2, C3 | C3, C4 |
| 110° C | C2, C3 | C2, C3, C4 | C3, C4 | C4 |

FIG. 8

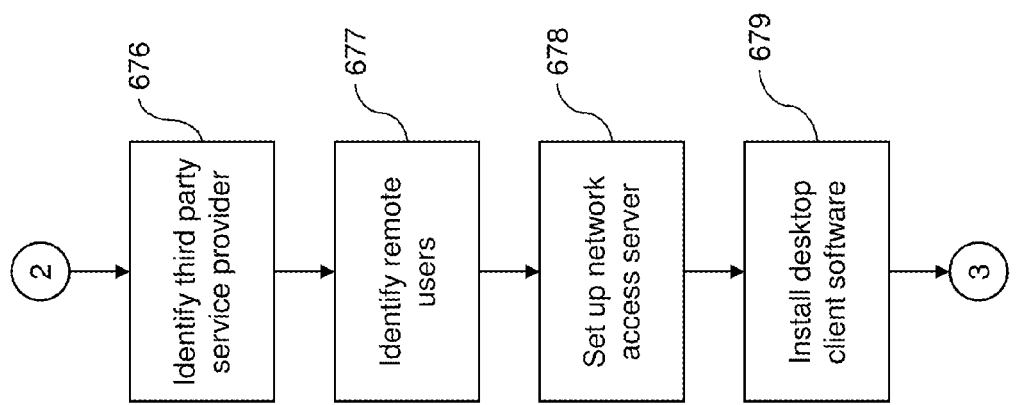

METHODOLOGY OF GRADING RELIABILITY AND PERFORMANCE OF CHIPS ACROSS WAFER

BACKGROUND

The present disclosure relates to integrated circuit designs and, more particularly, to a system and method for grading reliability and performance of chips throughout semiconductor manufacturing, packaging, burn-in, and use.

Manufacturing variations may cause one or more parameters to vary between integrated circuits that are formed according to the same design. These variations can affect chip operating frequency (i.e., switching speed) and reliability. For example, due to variations in the equipment, operators, position on a wafer, etc., a specific parameter may vary between chips built on the same wafer, chips built on different wafers in the same lot, and/or on chips built on different wafers in different lots. If this parameter is, for example, channel length, width, or threshold voltages, the transistors of each chip may be different such that the performance varies (e.g., faster or slower). Chips that are fabricated either at the "slow" end or the "fast" end of a process distribution (e.g., a process-temperature-variation (PVT) space) may not be desirable. For example, chips that are fabricated at the "slow" end of such a process distribution may not meet the desired performance specification (i.e., may not have a fast enough switching speed); whereas chips fabricated at the "fast" end of this process distribution may exhibit excessive power and leakage current. Thus, it is possible to run faster parts at lower voltage and slower parts at higher voltage, in order to reduce the maximum power for the distribution of parts. The division between the fast and slow portions of the distribution (i.e. the cutpoint), is generally determined a priori during the design phase.

SUMMARY

According to one embodiment herein, a method of sorting integrated circuit devices is disclosed. According to the method, integrated circuit devices are manufactured on a wafer according to an integrated circuit design using manufacturing equipment. The integrated circuit design produces identically designed integrated circuit devices that perform differently based on manufacturing process variations. The identically designed integrated circuit devices are for use in a range of environmental conditions, when placed in service. Testing is performed on the identically designed integrated circuit devices using testing equipment to produce test results. Environmental maximums are individually predicted for each identically designed integrated circuit device of the identically designed integrated circuit devices, using a computerized device operatively connected to the testing equipment. The environmental maximums comprise ones of the environmental conditions that must not be exceeded for each identically designed integrated circuit device to perform above a given failure rate. Each identically designed integrated circuit device is assigned at least one of a plurality of grades based on the environmental maximums predicted for each identically designed integrated circuit device, using the computerized device. The identically designed integrated circuit devices are provided to different forms of service having different ones of the environmental conditions based on the grades assigned to each identically designed integrated circuit device, using the computerized device.

According to another embodiment herein, a system for sorting integrated circuit devices for use in a range of environmental conditions, when placed in service, is disclosed. The system includes a processor and a performance monitor operatively connected to the processor. The performance monitor performs testing on the integrated circuit devices using testing equipment to produce test results. The processor individually predicts environmental maximums for each integrated circuit device. The environmental maximums comprise ones of the environmental conditions that must not be exceeded for each integrated circuit device to perform above a given failure rate. The processor assigns each integrated circuit device at least one of a plurality of grades based on the environmental maximums predicted for each integrated circuit device.

According to an additional embodiment herein, a non-transitory computer readable storage medium readable by a computerized device is disclosed. The non-transitory computer readable storage medium stores instructions executable by the computerized device to perform a method of sorting integrated circuit devices. According to the method, integrated circuit devices are manufactured on a wafer according to an integrated circuit design using manufacturing equipment. The integrated circuit design produces identically designed integrated circuit devices that perform differently based on manufacturing process variations. The identically designed integrated circuit devices are for use in a range of environmental conditions, when placed in service. Testing is performed on the identically designed integrated circuit devices using testing equipment to produce test results. Environmental maximums are individually predicted for each identically designed integrated circuit device of the identically designed integrated circuit devices using a computerized device operatively connected to the testing equipment. The environmental maximums comprise ones of the environmental conditions that must not be exceeded for each identically designed integrated circuit device to perform above a given failure rate. Each identically designed integrated circuit device is assigned at least one of a plurality of grades based on the environmental maximums predicted for each identically designed integrated circuit device, using the computerized device. The identically designed integrated circuit devices are provided to different forms of service having different ones of the environmental conditions based on the grades assigned to each identically designed integrated circuit device, using the computerized device.

BRIEF DESCRIPTION OF THE DRAWINGS

The embodiments herein will be better understood from the following detailed description with reference to the drawings, which are not necessarily drawn to scale, and in which:

FIG. 1 is a chart illustrating the relationship between process speed and power usage for integrated circuits manufactured with the same process;

FIG. 2 is a chart illustrating the relationship between process speed and power usage for integrated circuits manufactured with the same process using a 2-bin selective binning process;

FIG. 3 is a chart illustrating the relationship between process speed and power usage for integrated circuits manufactured with the same process using a multi-bin selective binning process;

FIG. 8 an illustration of a reliability acceptance table according to embodiments herein;

FIG. 16 is a schematic diagram of a virtual private network system according to embodiments herein.

DETAILED DESCRIPTION

Figure 4:
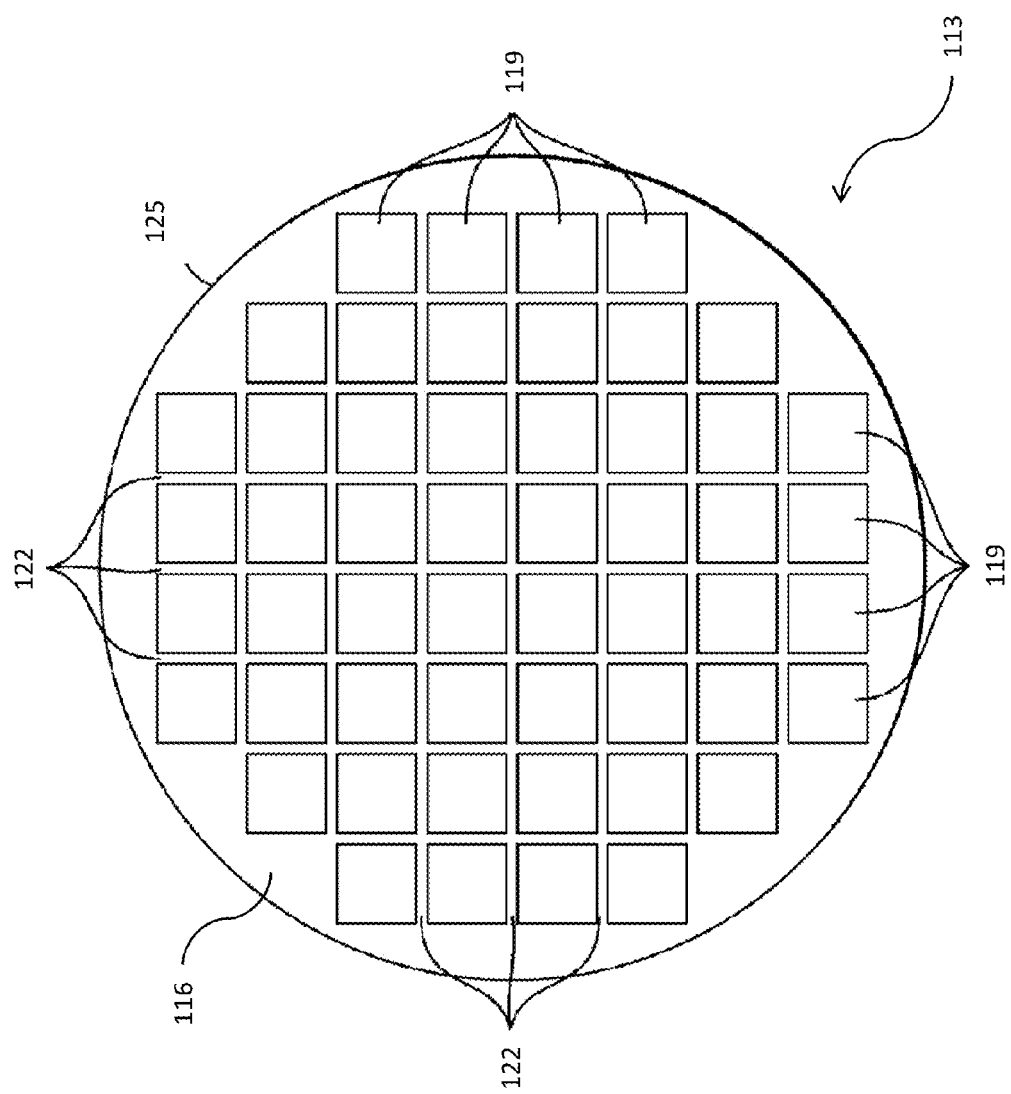
FIG. 4 is a top view of a wafer having multiple product chips according to embodiments herein.

As mentioned above, the process of selective voltage binning can run faster parts at lower voltage and slower parts at higher voltage, in order to reduce the maximum power for the distribution of parts. However, conventional selective voltage binning assumes a certain non-changing performance/current leakage relationship, which may not always be correct. Indeed, some large variation in current leakage can occur. Because of this, customers are often advised that the binned devices may not precisely operate within their specific bin classification and, instead, each is provided with a +/− bin variation range (e.g., +/−3 bins). The embodiments described below address this issue and are able to supply binned devices that are guaranteed to operate within their specific voltage bin (without requiring a bin variation range).

FIG. 1 is a chart illustrating the relationship between process speed and power usage for identically manufactured integrated circuit devices. FIG. 2 is a chart illustrating the relationship between process speed and power usage for integrated circuits manufactured with the same process using a 2-bin selective binning process, and FIG. 3 is a chart illustrating the relationship between process speed and power usage for integrated circuits manufactured with the same process using a multi-bin selective binning process.

Post-manufacturing voltage binning is a technique that is used to sort manufactured chips into bins based on whether they were fabricated at either the "slow" end or the "fast" end of a process distribution, and to vary the voltage requirements for the chips depending upon the bins they are assigned to in order to reduce maximum chip power. For example, FIG. 1 is a diagram illustrating the dynamic power and process speed for chips that are manufactured from a common design, but that are different because of different processing conditions that occur within acceptable manufacturing tolerances. Selective Voltage Binning (SVB) is also sometimes referred to as Adaptive Voltage Scaling (AVS).

In FIG. 1, the worst-case process range on curve 100 drives the required voltage for ultimately running the chip, creating an unnecessarily high operating voltage. However, with selective voltage binning shown in FIGS. 2 and 3, every chip is tested to measure operating speed and the chips are sorted into voltage bins accordingly. This reduces maximum chip power by running fast process chips at lower Vdd, as shown by curves 102 and 104. Thus, the devices are binned by process, and slow chips are operated at normal Vdd without change to slow-corner voltage, timing, and power (because slow-corner power is not limiting). However, as shown in FIGS. 2-3, fast chips are operated at reduced Vdd because the fast chips have speed to spare, and, at reduced Vdd, power is reduced.

For example, in a process-voltage-temperature space, the temperature and voltage of the chip may be fixed, and the leakage may be measured. If the leakage is above a specific cut point, then the chip is on the fast end of the process-voltage-temperature space and placed in a fast chip bin. If the leakage is below the cut point, then the chip is on the slow end of the process-voltage-temperature space and placed in a slow chip bin. The fast devices will be sorted into the "fast" bin, and will be utilized at lower voltages than the slow devices that are sorted into the "slow" bin. Because the fast devices have more leakage, the fast devices will consume more power. After the chips are sorted into bins according to the cut point, an optimal supply voltage (Vdd) for operating the chips in each bin is determined. Since both dynamic power consumption and static power consumption are exponentially proportional to the Vdd, a reduction in the required Vdd will reduce both dynamic and leakage power consumption and, thus, overall power consumption.

Selective voltage binning (SVB) procedures typically use several performance screen ring oscillator (PSRO) measurements to quantify chip performance after manufacturing. Voltage binning of individual integrated circuit devices is achieved by operating the integrated circuits at a plurality of required clock frequencies, and, for each of those frequencies, determining the minimum supply voltage level that produces a pass result for a series of applied test vectors. The bin voltage establishes a minimum voltage needed for performance of the integrated circuit device at normal operating conditions. Since this is done at a known voltage and temperature, the PSRO measurements are essentially a statement of the aggregate effect of a wide variety of different parameters upon that circuit. However, different types of circuits are typically present within a single chip, and some of these different types of circuits will exhibit different sensitivities to the variety of parameters. Thus, if a PSRO or some set of sample/reference logic paths are used to determine the bin voltage, there will likely be some circuits that inevitably track differently such that they are at a slightly different point in their best case to worst-case performance range.

SVB is an open loop technique that provides a bin identifier associated with a voltage. AVS is a closed loop technique in which PSRO, or other performance monitor, is measured in the die and the results are used in the chip to adjust the voltage. While both techniques allow system power to be managed, they are not the same.

As mentioned above, the relatively fast integrated circuit devices consume more power than the relatively slow integrated circuit devices. The relatively fast integrated circuit devices can be operated at a lower voltage to keep their operating speed and power consumption approximately equal to the relatively slow integrated circuit device. According to embodiments herein, a method is disclosed that leverages alteration of use conditions to optimize yield and reliability.

As described above, one of the advantages of selective voltage binning is to reduce maximum chip power by running fast process chips at lower Vdd. Slow chips can be operated at normal Vdd; however, since fast chips have speed to spare, the fast chips can be operated at reduced Vdd. At reduced Vdd, the power consumption is reduced. Using this concept, multiple voltage bins enable lower ranges of Vdd on the fastest parts. This lowers the maximum power consumption.

While SVB evaluates the chip after it has been manufactured, according to the methodology disclosed herein, semiconductor chips are categorized by grades of performance and reliability at the wafer level during the manufacturing process, as well as after manufacture based on a plurality of parameters, such as clock speed and circuit metrics, such as Vmax, Vth, Ion, Ioff, conductor current carrying capability, and BEOL insulating inter-dielectric (ILD) pads, to name a few. Reliability parameters may include operating temperature, Vmax, and power-on-hours (POH), among others. Analysis is typically performed by a verification tool, which subjects the tested device to various test cases and scenarios. Various known verification methods can be used for this purpose, such as simulation-based methods and/or formal verification methods. The embodiments described herein take account of the fact that in many of the process steps, some tools or chambers or their combinations may cause integrated circuit devices processed through them to vary across the wafer. Thus, embodiments herein set different grade levels to chips during the manufacturing process, and identify wafers or chips that satisfy the needs of different customers. Furthermore, according to some embodiments, the "in situ" destination can be changed or selected based on tests performed on the wafers as they move through the fabrication facility, and following packaging and burn-in steps, when appropriate. For example, following the steps of packaging and burn-in, the methods described herein will further differentiate the grades of these chips, in order to define the route of each chip, for example, to a high-end server device, a low-end server device, a game device, a mobile communication device, or something else on a graded scale.

With reference to FIG. 4 and in accordance with an embodiment of the invention, a wafer 113 includes a front side 116 that has been processed by front-end-of-line processes to fabricate a plurality of substantially identical product chips 119. Each product chip 119 includes one or more integrated circuits that contain device structures. The product chips 119 are arranged in an array of rows and columns within the outer periphery of the wafer 113. The number of product chips 119 may range from approximately ten to up to tens of thousands of chips. Among other factors, the actual number of product chips 119 yielded from wafer 113 is a function of the individual chip size, as well as the wafer size. Scribe-line channels 122 are present between adjacent pairs of product chips 119 in the array. The scribe-line channels 122 are free of device structures of the integrated circuit, but may contain test devices used to evaluate post-fabrication circuit quality.

Wafer 113 may be any suitable substrate containing a semiconductor material that a person having ordinary skill in the art would recognize as suitable for forming an integrated circuit. For example, the wafer 113 may be composed of a monocrystalline silicon-containing material, such as bulk or SOI single crystal silicon. For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc. For example, the semiconductor material constituting wafer 113 may be lightly doped with an impurity to alter its electrical properties. Specifically, the wafer 113 may be lightly doped with an n-type impurity species to render it initially n-type or lightly doped with a p-type impurity species to render it initially p-type. Standard round wafer sizes for wafer 113 range from a diameter of 100 mm to a diameter of 300 mm. The wafer 113 also includes a back side that is connected to the front side 116 by a peripheral edge 125.

Figure 5:
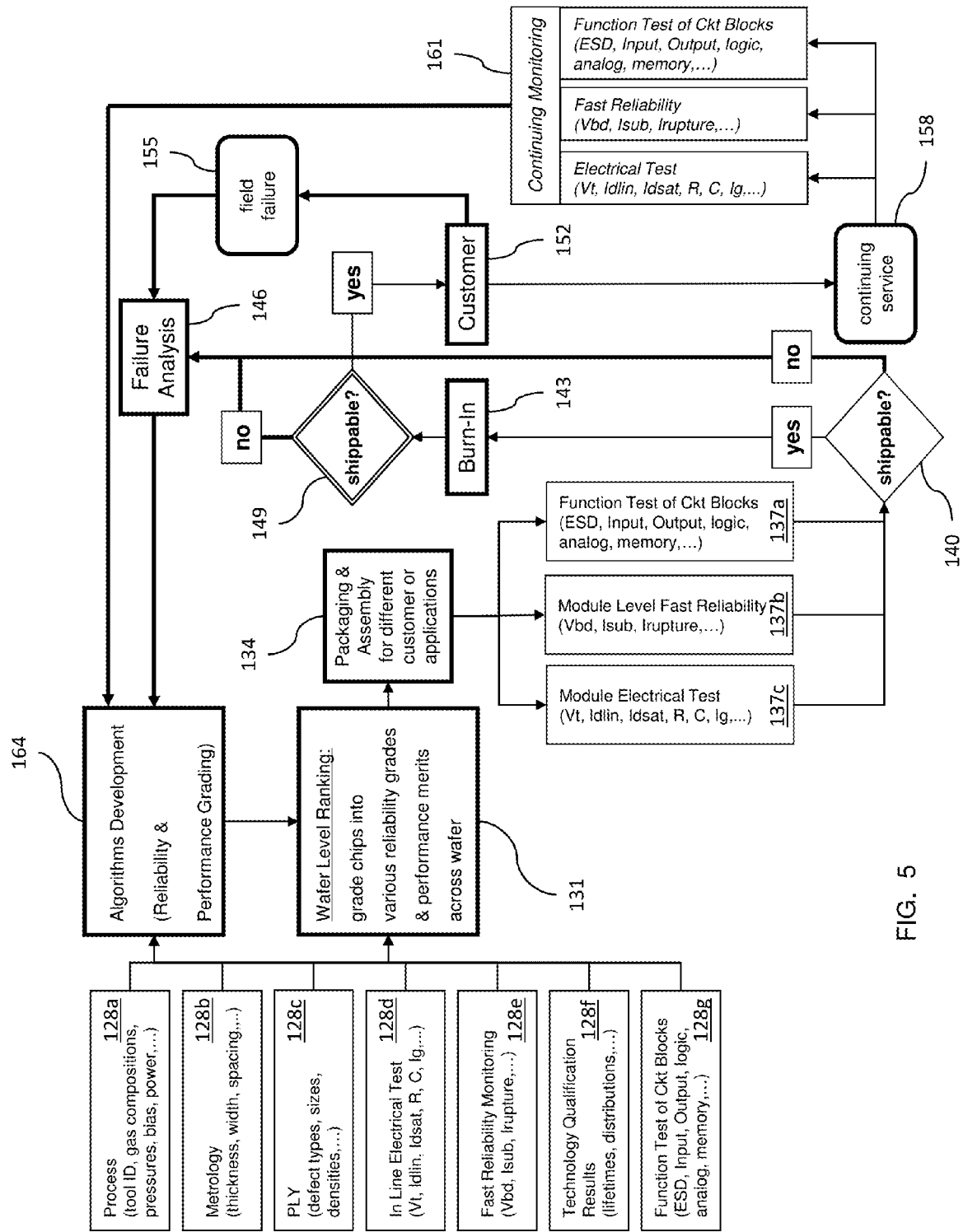
FIG. 5 is a flow diagram illustrating embodiments herein.

Current methods for reliability disposition are typically 'coarse' and characterization of chips at wafer, lot, or timeframe level generally do not take into account how the application conditions of the final chip affects the reliability of the chip. Embodiments herein utilize data available and available product voltage buckets to optimize yield and reliability in a data driven manner. Referring to FIG. 5, the method described herein takes as input a wide variety of data and information concerning the chips during the manufacturing process, such as processing tool events including tool identification, gas compositions, pressures, etc., as shown at 128a; metrology parameters including thickness, width, spacing, etc., as shown at 128b; PLY parameters including defect types, sizes, densities, etc., as shown at 128c; electrical parameters including Vt, Idin, Idsat, etc., as shown at 128d; fast reliability parameters including Vbd, Isub, Irupture, etc., as shown at 128e; technology and product qualification outcomes including lifetimes, distributions, etc., as shown at 128f; and functional test parameters including ESD, Input, Output, logic, etc., as shown at 128g.

As would be known in the relevant art, PLY stands for process limited yield, which may be a variety of measurements, including PLY optical review and PLY scanning electron microscopy (SEM) review.

The data and information are analyzed, at 131, using a variety of processes and metrics to grade all the chips on a wafer into various reliability grades and performance merits across the wafer. The different grade levels established by embodiments herein can be used to identify wafers or chips that satisfy the needs of different customers; for example, a high-end server chip (1.25V, 150° C., 100K POH), a low-cost server chip (1.00V, 125° C., 100K POH), a game chip (1.00V, 90° C., 30K POH), or a mobile communication device chip (0.9V, 50° C., 10K POH). All the chips have the same low fail rate instead of different fail rates as may result from the SVB process mentioned above.

Figures 6, 7:
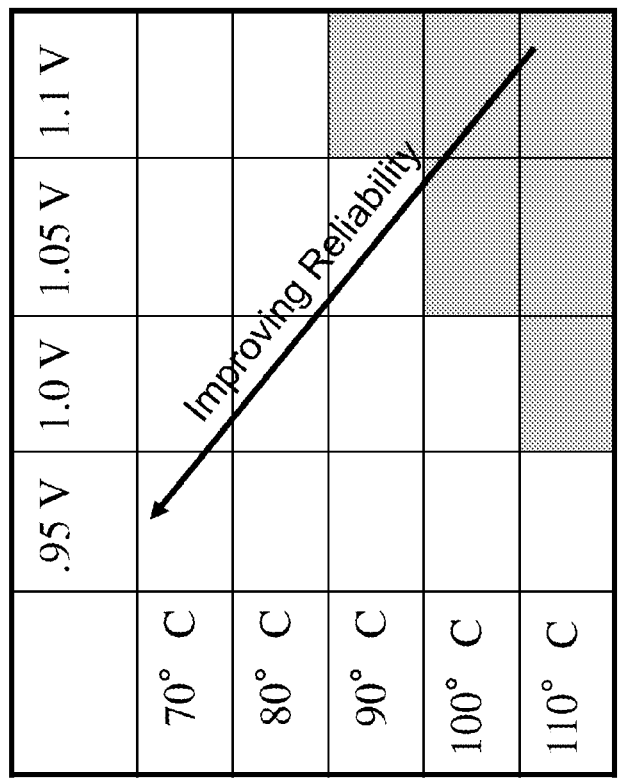
FIG. 6 a partial table of evaluation parameters according to embodiments herein.
FIG. 7 an illustration of a reliability table according to embodiments herein.

Therefore, the chips will potentially be used in a range of environmental conditions, when placed in service. Thus, testing is performed on the chips using testing equipment to produce test results to help predict how the chips will perform in different operating conditions (e.g., see different identically designed chips performing differently in the different boxes in FIGS. 7 and 8). Thus, the methods and systems herein individually predict environmental maximums for each chip. Such environmental maximums are the environmental conditions (e.g., Vmax, operating frequency, temperature, and power-on hours) that must not be exceeded for each chip to perform above a given failure rate (to not fail more often than a given rate). As shown in FIGS. 7 and 8, not all chips will behave the same in different environments because of manufacturing differences and, therefore, not all chips receive the same environmental maximums (even though all chips are identically manufactured). Therefore, with systems, structures, and methods herein, all the chips have the same low fail rate instead of different fail rates as may result from an SVB process. The systems and methods herein assigning each chip at least grade based on the environmental maximums predicted for each the chip, and the different chips are provided to different forms of service (each form of service or use has potentially different environmental conditions) based on the grades assigned to each the chip (allowing all chips the same low failure rate).

After the chips have been sorted based on reliability and performance, the chips proceed to packaging/module assembly according to customer applications, as shown at 134. At this point, the chips are tested for their specific application. Testing may include a functional test of the circuit blocks 137*a*, module level fast reliability testing 137*b*, and/or a module electrical test 137*c*. Other appropriate tests may be included.

If the chips pass the tests and are deemed shippable, at 140, they proceed to burn-in 143; otherwise, they are sent for failure analysis 146. Not all chips will require or benefit by burn-in, as will be described below.

Embodiments herein provide not only the advantage of in the field recovery, but also elimination of the need for a performance guardband prior to product shipment. Thus, the embodiments herein provide a significant benefit for semiconductor products requiring high reliability. Specifically, semiconductor products that require a high degree of reliability are typically subjected to a burn-in treatment 143 prior to customer shipment. The purpose of this burn-in treatment is to accelerate defect mechanisms to the point of failure so that any failing product samples are discarded prior to customer shipment. Typical burn-in treatments are performed at higher than normal operating conditions (i.e., at an elevated voltage and an elevated temperature). These burn-in conditions also accelerate the negative bias temperature instability (NBTI) mechanism, which results in product performance reduction.

If the chips survive the burn-in process and are deemed shippable, at 149, they can be shipped to a customer 152; otherwise, they are sent for failure analysis 146.

Following the steps of packaging 134 and burn-in 143, embodiments herein may further differentiate the grades of chips, in order to define the route of each chip, be either high-end server grade, or something lower for use by a customer 152. The customer 152 may employ the chip in their products in the field. When chips fail in the field 155, they can be sent for failure analysis 146; otherwise, the continuing service aspects 158 of the embodiments herein provide for continuous performance monitoring 161 of the already graded chips in products in the fields. Such continuing monitoring 161 may include customer feedback associated with functional tests of the circuit blocks, fast reliability testing, and/or electrical tests. Other appropriate tests may be included.

Failure analysis 146 may include examination of the mode of failure of the specific chip, such as failure of a circuit element on the chip, and examination of structural defects, such as etching damage. The mode of failure information may be used to try to determine the cause of failure of the chip. For example, if a defective product is detected following the burn-in process, it may indicate that a cause of this failure lies in the wafer fabrication line up to the completion of wafer.

Customer feedback from continuing monitoring 161 and information from failure analysis 146 can be used to refine the reliability and performance grading, as shown at 164. Therefore, by locating a failure process by analysis on the basis of detected failure information, feeding the result of the analysis back to the wafer fabrication line, and repairing the failure process, it is possible to prevent further formation of a defective product. The analysis algorithms are refined at 164 based on the continuous performance monitoring 161 of the already graded chips in products in the fields and the analysis of failed products.

According to embodiments herein, module burn-in and testing, system performance, and customer feedback are used as inputs to develop and refine a set of processes that are integrated horizontally as well as vertically to calculate the performance and reliability grades of each chip/wafer. Horizontal integration may include the processes, measurements, and electrical characterizations of the wafer fabrication. Vertical integration may include module assembly, system integration, and customer site usage of the chip/wafer.

The reliability metrics can be a combination of yield metrics, Kerf measurements, reliability measurements, in-line measurements (for example, CD or oxide thickness), and process tool feedback (for example, oxidation ramp rate). For example, the yield metrics can be generic pass/fail or focused on specific failure modes. In some embodiments, the yield metrics may be related to systemic analysis of a specific chip on a wafer and its nearest neighbors. For example, if some chips in a particular area of a wafer tend to have low reliability, those around it will likely have the same consistency. In some embodiments, the yield metrics may be related to systemic analysis of an ability of a specific chip on a wafer to repair itself. For example, some chips, such as DRAM or SRAM chips, may have built-in redundancy that enables them to repair defects in their integrated circuitry. If some chips in a particular area of a wafer require no repairs while other chips require several repairs, this tells us something about the reliability of the chips. Threshold values for the number of failures may be related to specific patterns or events that may be known to not lead to failure. Such threshold values may be based on previous reliability assessments.

Some of the variables that affect Kerf measurements may include Tiny, the resistance of the metal used in fabricating the chip, capacitance of the circuit elements, the macro yield of the array, etc.

FIG. 6 shows a partial table of some evaluation parameters that may investigated for each chip on a wafer. Some of the reliability measurements may include time dependent dielectric breakdown (TDDB) for the oxide, the metal, the gate structure (PC), the contact points (CA), as well as the metal electromigration and metal stress migration. Each of these parameters may have a score related to voltage, temperature, and failure rate, indicated by $a_i$, $b_i$, and $c_i$. For each chip on a wafer, there may be a reliability score based on that chips intended use at a particular temperature and voltage. Indeed, reliability metrics can be combinations of multiple product reliability measurements, such as for specific age of the wafer or region of wafer or on similar product, or for product specific scaling factors, for example the area of thick gate oxide, MIM cap, deep trench, etc.

Embodiments herein assess, on a part-by-part basis, not only the power/performance aspect of use of the chip, but also the reliability of the chip. For example, some chips may be inherently reliable such that they do not require burn-in. Some chips may have merely specific technology requirements, while other chips may require that the whole chip be stress tested. One method of determining reliability may include the following steps:

1) Calculate temperature and voltage reliability for the components on the chip.
2) Calculate the failure rate for a temperature and voltage matrix, such as shown in FIG. 7.

3) From the temperature and voltage matrix, define acceptable regions of operation. There may be multiple temperature and voltage matrixes depending on the application. What FIG. 7 shows is that, for example, a chip designed to operate at 0.95V may operate reliably up to 110° C., while a chip designed to operate at 1.1V may not operate reliably above 80° C.

4) Determine acceptable freq/power specification points based on the customer's requirements, such as:
C1=Good part for Frequency 1, Power 1
C2=Good part for Frequency 2, Power 2
C3=Good part for Frequency 3, Power 3
C4=Good part for Frequency 4, Power 4

5) Find acceptable intersection of power performance with reliability on a part-by-part basis, such as shown in FIG. 8. This is a trade-off with respect to temperature, frequency, and power. For example, FIG. 8 shows that a C1 rated part cannot meet the power and frequency requirements below 1.0V and that a C3 rated part cannot meet the power and frequency requirements below 80° C.

Figure 9:
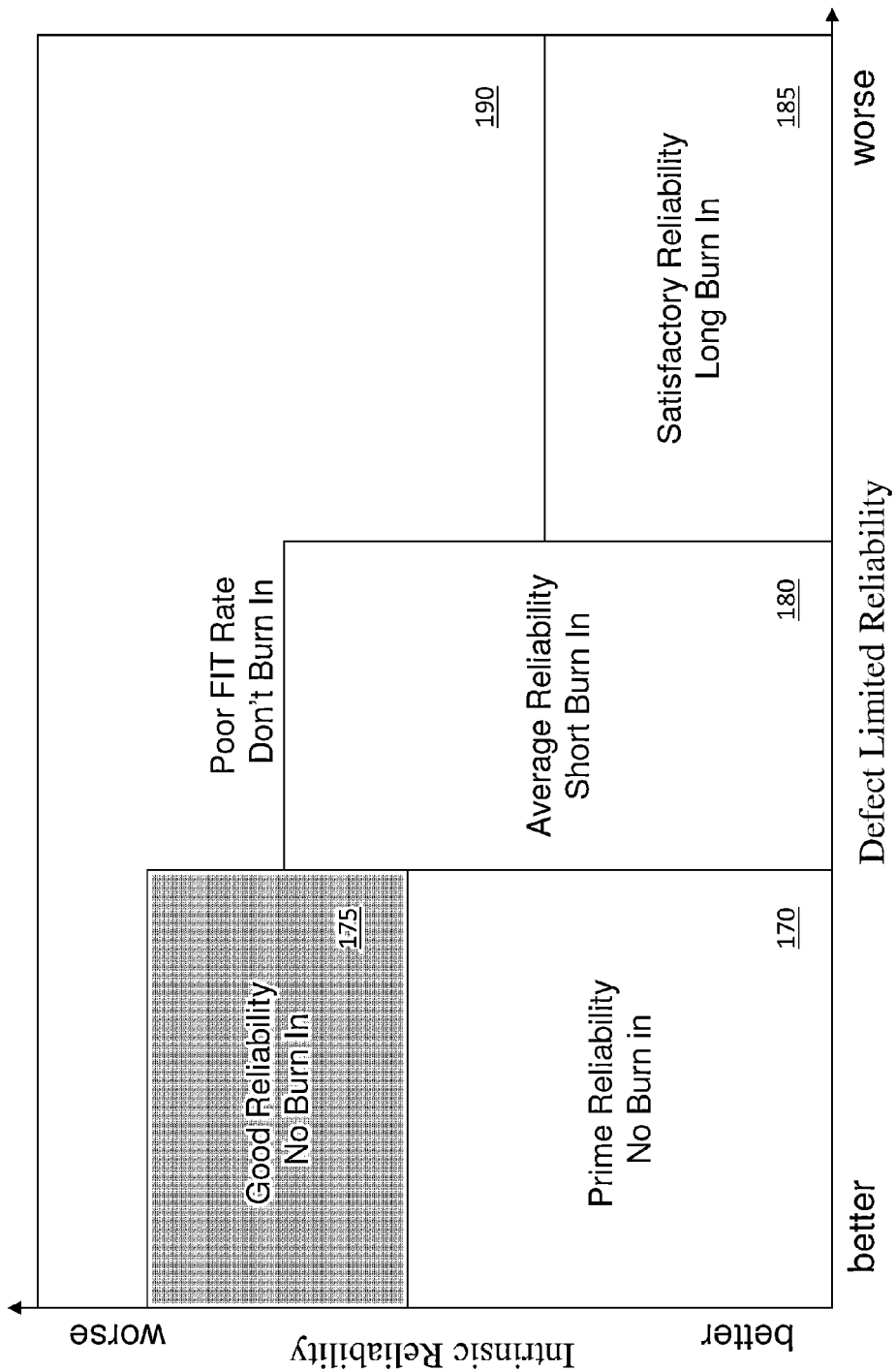
FIG. 9 is an illustration of relative reliability parameters according to embodiments herein.

FIG. 9 is an illustration of customer dependent relative reliability measurements. Such a scale provides a relative indication of which applications a specific chip may be used for. The vertical axis is Intrinsic Reliability, which is based on manufacturing tolerances for the structure of the device, such as wiring size, dielectric thickness, etc. The horizontal axis is Defect Limited Reliability, which is based on manufacturing errors, such as dirt, breakage, short circuits, etc.

In FIG. 9, the area of Prime Reliability 170 has the relatively best intrinsic reliability and relatively best defect limited reliability. These chips would likely be used by a customer in high-end server applications. Furthermore, these chips would typically not require burn-in. The area of Good Reliability 175 has the relatively best defect limited reliability and relatively somewhat worse intrinsic reliability. These chips may be used by a customer in lower cost server applications. These chips would typically not require burn-in due to their relative lack of defects and relatively good defect limited reliability. The area of Average Reliability 180 has the relatively best intrinsic reliability and relatively somewhat worse defect limited reliability. These chips would typically require a short burn-in to clear up some defects. The area of Satisfactory Reliability 185 has the relatively best intrinsic reliability and relatively worst defect limited reliability. These chips would typically require a long burn-in to clear up some defects. Chips from this area would likely be used in low cost, gaming type applications. The area of Low Failure-in-Time Rate 190 has the relatively worst intrinsic reliability and relatively worst defect limited reliability. Chips from this area would likely be used in low-end applications, such as mobile phones. It is not recommended to apply burn-in to these chips since that would accelerate the rate of failure.

Figure 10:
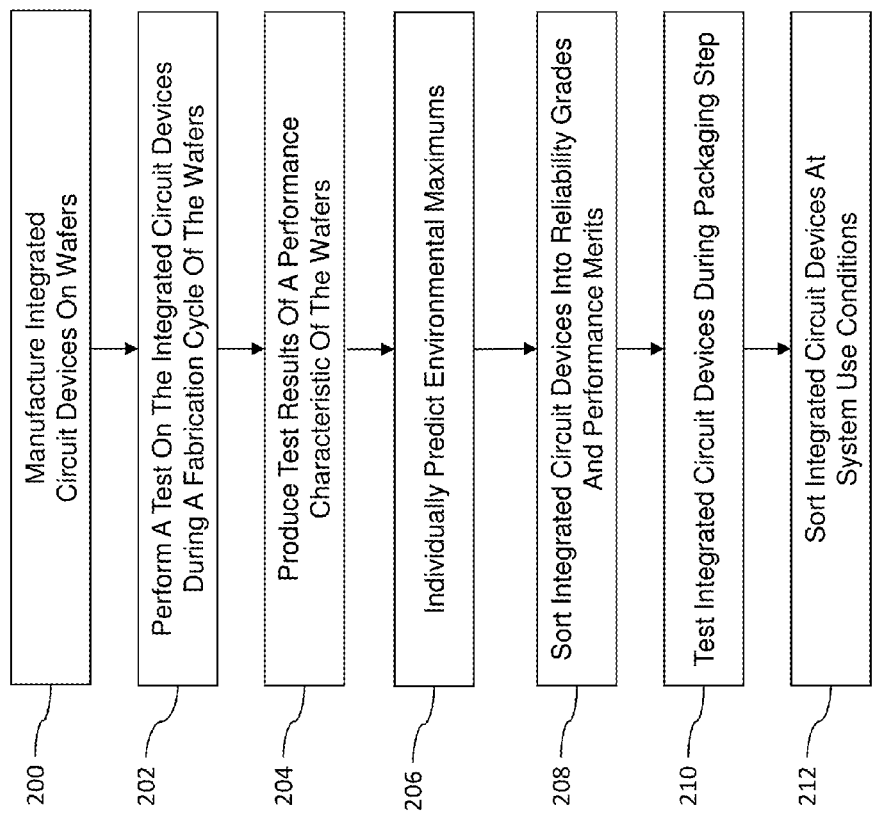
FIG. 10 is a flow diagram according to embodiments herein.

FIG. 10 is a flow diagram illustrating an exemplary method of sorting integrated circuit wafers. Each of the wafers includes several integrated circuit devices. In item 200, this exemplary method manufactures integrated circuit devices according to an integrated circuit design using manufacturing equipment. The integrated circuit design produces integrated circuit devices that are identically designed, but perform differently based on manufacturing process variations.

In item 202, this exemplary method performs a test on the integrated circuit devices during a fabrication cycle of the wafers. In item 204, test results of a performance characteristic of the wafers are produced. The performance characteristics may include Vmax, operating frequency, temperature, and power-on hours, among others. The chips will potentially be used in a range of environmental conditions, when placed in service. Thus, in item 204, testing was performed on the chips using testing equipment to produce test results to help predict how the chips will perform in different operating conditions (e.g., see different identically designed chips performing differently in the different boxes in FIGS. 7 and 8). Thus, in item 206, the methods and systems herein individually predict environmental maximums for each chip. Such environmental maximums are the environmental conditions (e.g., Vmax, operating frequency, temperature, and power-on hours) that must not be exceeded for each chip to perform above a given failure rate (to not fail more often than a given rate). As shown in FIGS. 7 and 8, not all chips will behave the same in different environments because of manufacturing differences and, therefore, not all chips receive the same environmental maximums (even though all chips are identically manufactured).

At 208, the integrated circuit devices are sorted into a plurality of reliability grades and performance merits across the wafer based on the test results and the performance limits. Thus, in item 208, the systems and methods herein assigning each chip at least grade based on the environmental maximums predicted for each the chip.

A test is performed on the integrated circuit devices during a packaging step of the integrated circuit devices, at 210. Test results of a performance characteristic of the integrated circuit device are produced.

At 212, the packaged integrated circuit devices are sorted based on performance requirements at system use conditions. Also, in item 212, the different chips are provided to different forms of service (each form of service or use has potentially different environmental conditions) based on the grades assigned to each the chip.

According to an embodiment herein, the method establishes a chip-specific performance limit for the integrated circuit devices. The performance limit is based on power consumption and reliability. A test is performed on the integrated circuit devices during a fabrication cycle of the wafers and test results of a performance characteristic of the wafers are produced. The integrated circuit devices are sorted into a plurality of reliability grades and performance merits across the wafer based on the test results and the performance limits.

According to an embodiment herein, a system for sorting integrated circuit devices comprises a processor and a performance monitor operatively connected to the processor. The processor establishes chip-specific performance limits for integrated circuit devices manufactured from an identical circuit design. The performance limits are based on power consumption and reliability of the integrated circuit devices. The performance monitor tests the integrated circuit devices during a fabrication cycle of a wafer comprising the integrated circuit devices and produces test results of a performance characteristic of the wafer. The processor sorts the integrated circuit devices into a plurality of reliability grades and performance merits across the wafer based on the test results and the performance limits.

According to a further embodiment herein, an article of manufacture is provided that includes a computer readable medium having computer readable instructions embodied therein for performing the steps of the computer implemented methods, including but not limited to the methods illustrated in FIGS. 5 and 10. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing.

Aspects of the present disclosure are described herein with reference to flowchart illustrations and/or block diagrams of methods, apparatus (systems), and computer program products according to various embodiments. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

In case of implementing the embodiments herein by software and/or firmware, a program constituting the software may be installed into a computer with dedicated hardware, from a storage medium or a network, and the computer is capable of performing various functions if with various programs installed therein.

Figure 11:
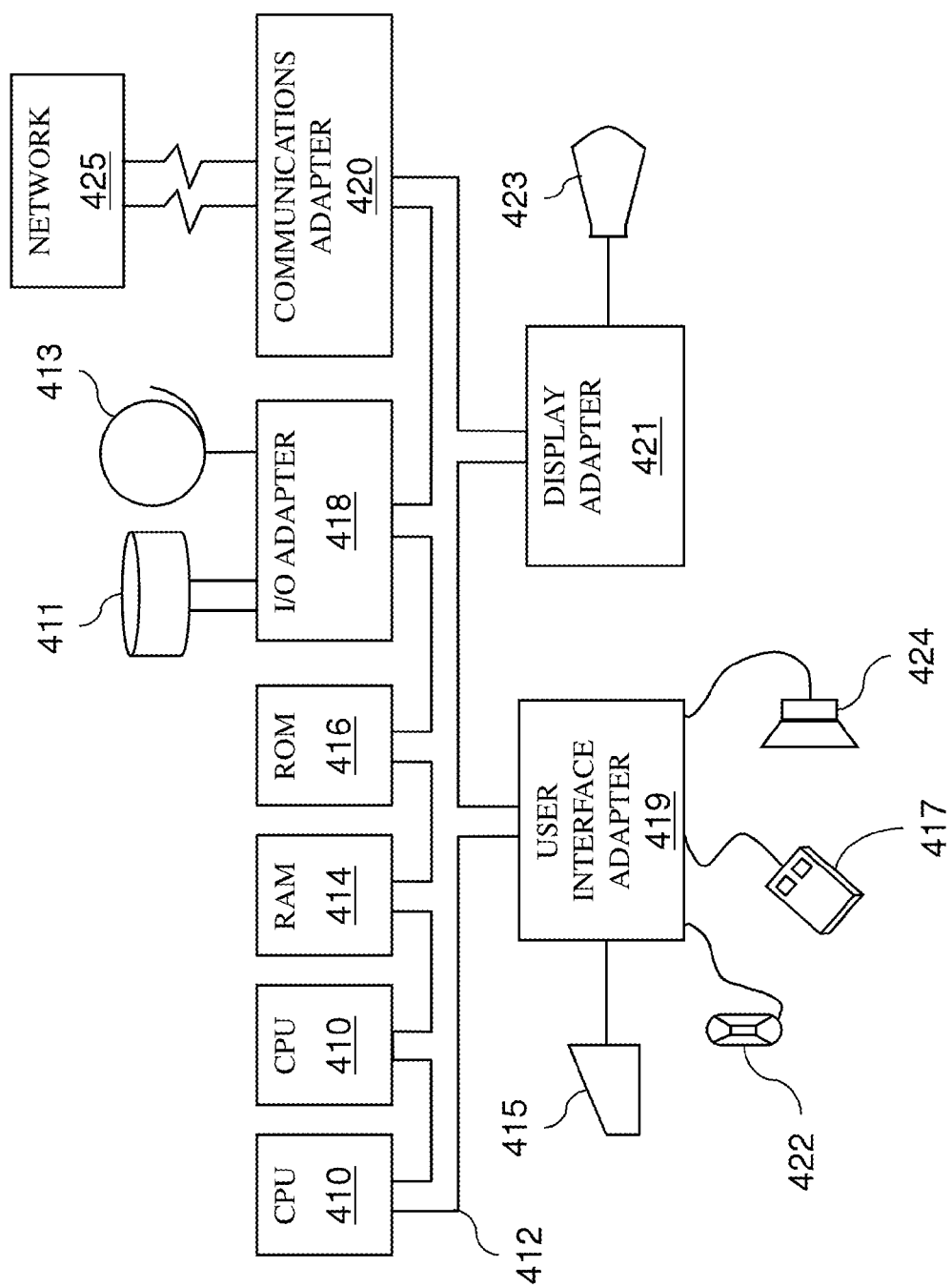
FIG. 11 is a schematic diagram of a hardware system according to embodiments herein.

A representative hardware environment for practicing the embodiments herein is depicted in FIG. 11. This schematic drawing illustrates a hardware configuration of an information handling/computer system in accordance with the embodiments herein. The system comprises at least one processor or central processing unit (CPU) 410. The CPUs 410 are interconnected via system bus 412 to various devices such as a random access memory (RAM) 414, read-only memory (ROM) 416, and an input/output (I/O) adapter 418. The I/O adapter 418 can connect to peripheral devices, such as disk units 411 and tape drives 413, or other program storage devices that are readable by the system. The system can read the inventive instructions on the program storage devices and follow these instructions to execute the methodology of the embodiments herein.

In FIG. 11, CPUs 410 perform various processing based on a program stored in a Read Only Memory (ROM) 416 or a program loaded from a peripheral device, such as disk units 411 and tape drives 413 to a Random Access Memory (RAM) 414. In the RAM 414, required data when the CPU 410 performs the various processing, or the like, is also stored as necessary. The CPU 410, the ROM 416, and the RAM 414 are connected to one another via a bus 412. An input/output adapter 418 is also connected to the bus 412 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 414, as necessary.

The system further includes a user interface adapter 419 that connects a keyboard 415, mouse 417, speaker 424, microphone 422, and/or other user interface devices such as a touch screen device (not shown) to the bus 412 to gather user input. Additionally, a communication adapter 420 including a network interface card such as a LAN card, a modem, or the like, connects the bus 412 to a data processing network 425. The communication adapter 420 performs communication processing via a network such as the Internet. A display adapter 421 connects the bus 412 to a display device 423, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium, such as the removable medium.

As will be appreciated by one skilled in the art, aspects of the systems and methods herein may be embodied as a system, method, or computer program product. Accordingly, aspects of the present disclosure may take the form of an entirely hardware embodiment, an entirely software embodiment (including firmware, resident software, micro-code, etc.), or an embodiment combining software and hardware aspects, which may all generally be referred to herein as a "circuit," "module", or "system." Furthermore, aspects of the present disclosure may take the form of a computer program product embodied in one or more computer readable medium(s) having computer readable program code embodied thereon.

Computer program code for carrying out operations for aspects of the present disclosure may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail, which executes a program that detaches the process software into a directory. Alternatively, the process software is sent directly to a directory on the client computer hard drive. When there are proxy servers, the process will, select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 12:
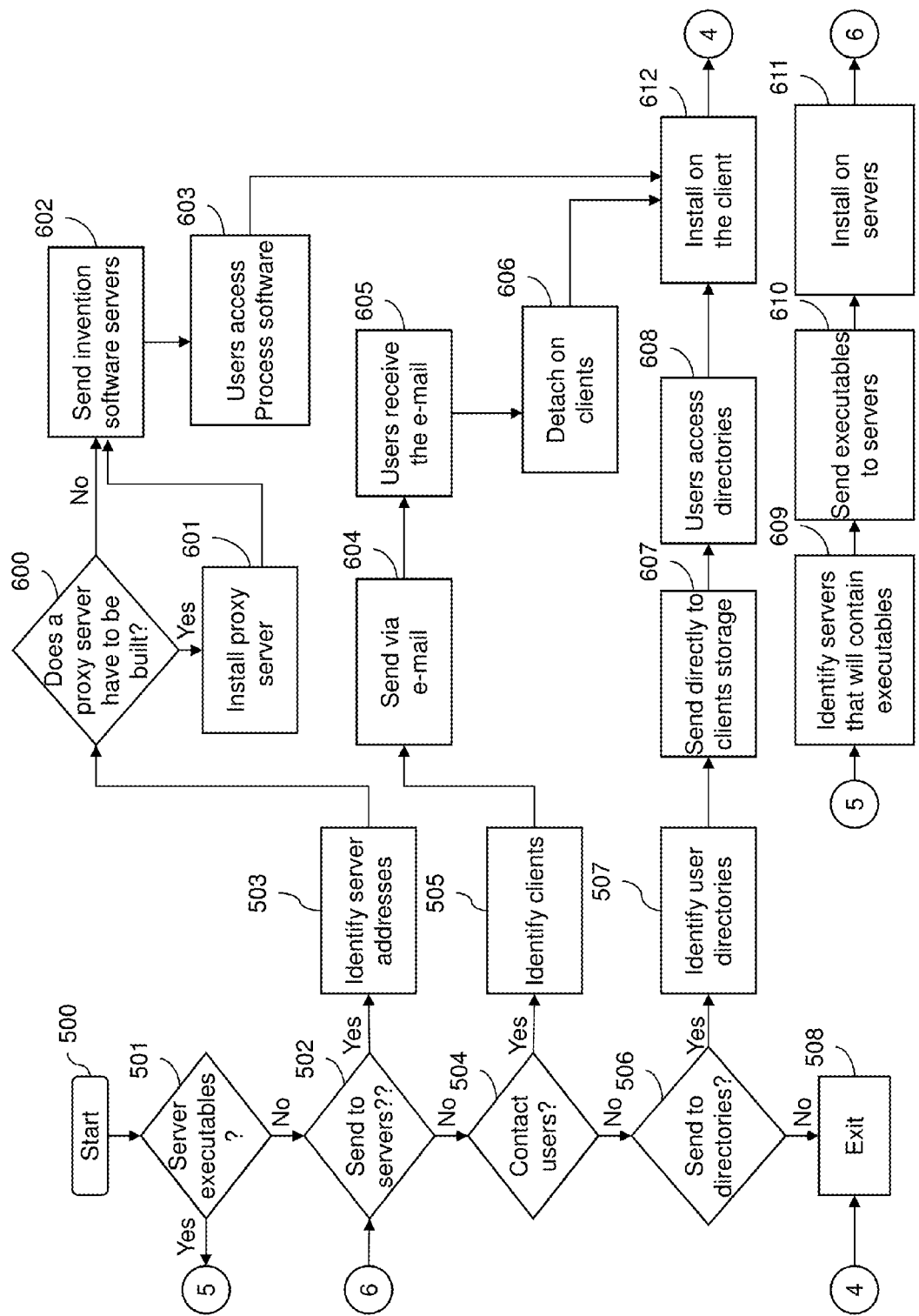
FIG. 12 is a schematic diagram of a deployment system according to embodiments herein.

In FIG. 12, Step 500 begins the deployment of the process software. The first thing is to determine if there are any programs that will reside on a server or servers when the process software is executed 501. If this is the case then the servers that will contain the executables are identified 609. The process software for the server or servers is transferred directly to the servers' storage via FTP or some other protocol or by copying through the use of a shared file system 610. The process software is then installed on the servers 611.

Next, a determination is made on whether the process software is to be deployed by having users access the process software on a server or servers 502. If the users are to access the process software on servers then the server addresses that will store the process software are identified 503.

A determination is made if a proxy server is to be built 600 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 601. The process software is sent to the servers either via a protocol such as FTP or it is copied directly from the source files to the server files via file sharing 602. Another embodiment would be to send a transaction to the servers that contain the process software and have the server process the transaction, then receive and copy the process software to the server's file system. Once the process software is stored at the servers, the users, via their client computers, then access the process software on the servers and copy it to their client computers file systems 603. Another embodiment is to have the servers automatically copy the process software to each client and then run the installation program for the process software at each client computer. The user executes the program that installs the process software on his client computer 612, and then exits the process 508.

In step 504, a determination is made whether the process software is to be deployed by sending the process software to users via e-mail. The set of users where the process software will be deployed are identified together with the addresses of the user client computers 505. The process software is sent via e-mail 604 to each of the users' client computers. The users receive the e-mail 605 and then detach the process software from the e-mail to a directory on their client computers 606. The users execute the program that installs the process software on their client computer 612, and then exit the process 508.

Lastly, a determination is made on whether to the process software will be sent directly to user directories on their client computers 506. If so, the user directories are identified 507. The process software is transferred directly to the users' client computer directory 607. This can be done in several ways such as but not limited to sharing of the file system directories and then copying from the sender's file system to the recipient users' file system or alternatively using a transfer protocol, such as File Transfer Protocol (FTP). The users access the directories on their client file systems in preparation for installing the process software 608. The users execute the program that installs the process software on their client computer 612, and then exits the process 508.

The process software is integrated into a client, server and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 13:
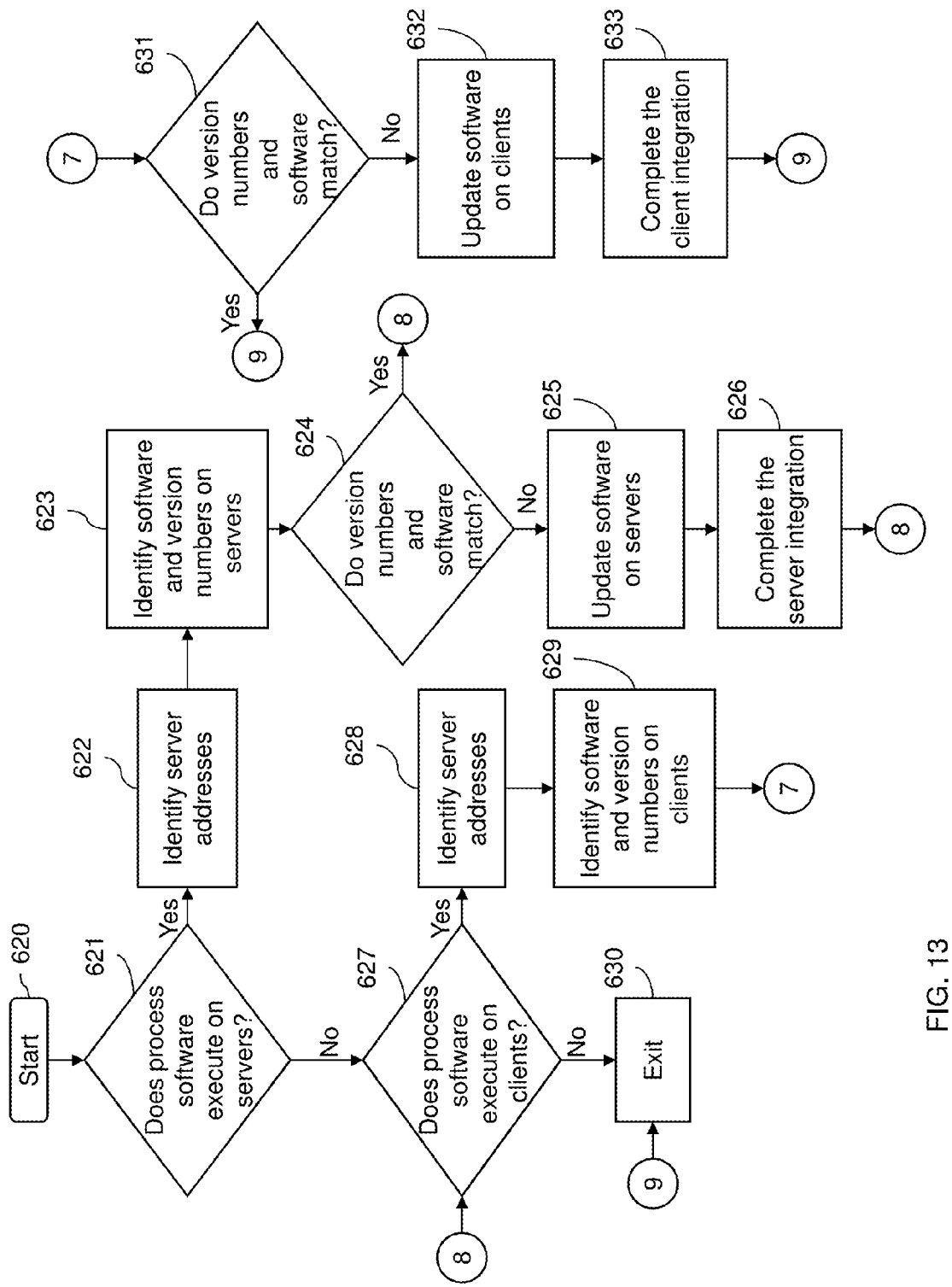
FIG. 13 is a schematic diagram of an integration system according to embodiments herein.

In FIG. 13, Step 620 begins the integration of the process software. The first thing is to determine if there are any process software programs that will execute on a server or servers 621. If this is not the case, then integration proceeds to 627. If this is the case, then the server addresses are identified 622. The servers are checked to see if they contain software that includes the operating system (OS), applications, and network operating systems (NOS), together with their version numbers, that have been tested with the process software 623. The servers are also checked to determine if there is any missing software that is required by the process software 623.

A determination is made if the version numbers match the version numbers of OS, applications and NOS that have been tested with the process software 624. If all of the versions match and there is no missing required software, the integration continues in 627.

If one or more of the version numbers do not match, then the unmatched versions are updated on the server or servers with the correct versions 625. Additionally, if there is missing required software, then it is updated on the server or servers 625. The server integration is completed by installing the process software 626.

Step 627, which follows either 621, 624, or 626, determines if there are any programs of the process software that will execute on the clients. If no process software programs execute on the clients, the integration proceeds to 630 and exits. If this not the case, then the client addresses are identified 628.

The clients are checked to see if they contain software that includes the operating system (OS), applications, and network operating systems (NOS), together with their version numbers, that have been tested with the process software 629. The clients are also checked to determine if there is any missing software that is required by the process software 629.

A determination is made as to whether the version numbers match the version numbers of OS, applications and NOS that have been tested with the process software 631. If all of the versions match and there is no missing required software, then the integration proceeds to 630 and exits.

If one or more of the version numbers do not match, then the unmatched versions are updated on the clients with the correct versions 632. In addition, if there is missing required software then it is updated on the clients 632. The client integration is completed by installing the process software on the clients 633. The integration proceeds to 630 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use, such as network bandwidth, memory usage, storage usage, etc., approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization, and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 14:
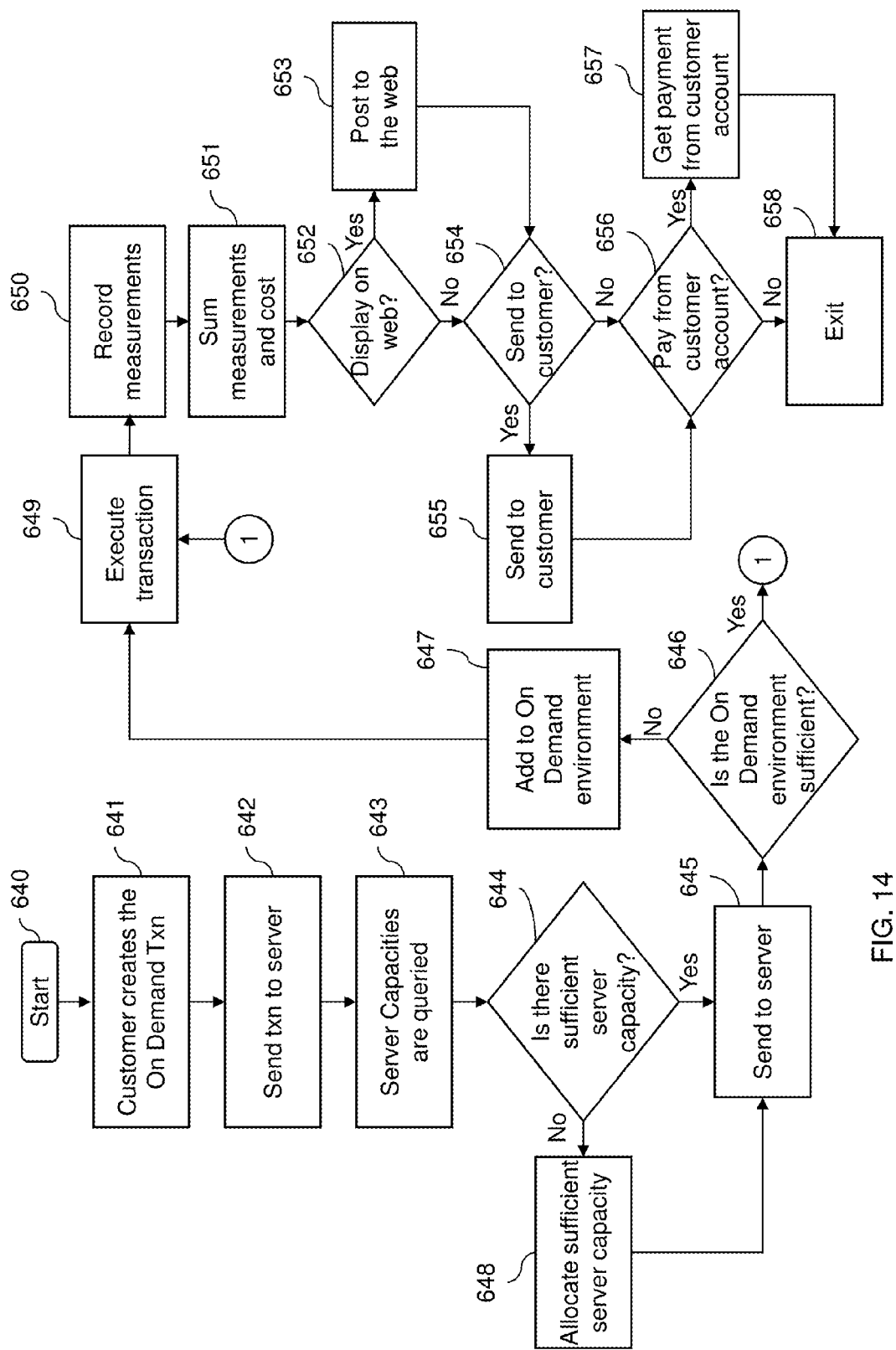
FIG. 14 is a schematic diagram of an on demand system according to embodiments herein.

In FIG. 14, Step 640 begins the On Demand process. A transaction is created that contains the unique customer identification, the requested service type, and any service parameters that further specify the type of service 641. The transaction is then sent to the main server 642. In an On Demand environment, the main server can initially be the only server, then, as capacity is consumed, other servers are added to the On Demand environment.

The server central processing unit (CPU) capacities in the On Demand environment are queried 643. The CPU requirement of the transaction is estimated, then the servers' available CPU capacity in the On Demand environment are compared to the transaction CPU requirement to see if there is sufficient CPU capacity available in any server to process the transaction 644. If there is not sufficient server CPU capacity available, then additional server CPU capacity is allocated to process the transaction 648. If there was already sufficient CPU capacity available, then the transaction is sent to a selected server 645.

Before executing the transaction, a check is made of the remaining On Demand environment to determine if the environment has sufficient available capacity for processing the transaction. This environment capacity consists of such things as, but not limited to, network bandwidth, processor memory, storage etc. 646. If there is not sufficient available capacity, then capacity will be added to the On Demand environment 647. Next, the required software to process the transaction is accessed, loaded into memory, then the transaction is executed 649.

The usage measurements are recorded 650. The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs, and then recorded as a charge to the requesting customer 651. If the customer has requested that the On Demand costs be posted to a web site 652 then they are posted 653.

If the customer has requested that the On Demand costs be sent via e-mail to a customer address 654, then they are sent 655. If the customer has requested that the On Demand costs be paid directly from a customer account 656, then payment is received directly from the customer account 657. The last step is to exit the On Demand process 658.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 15:
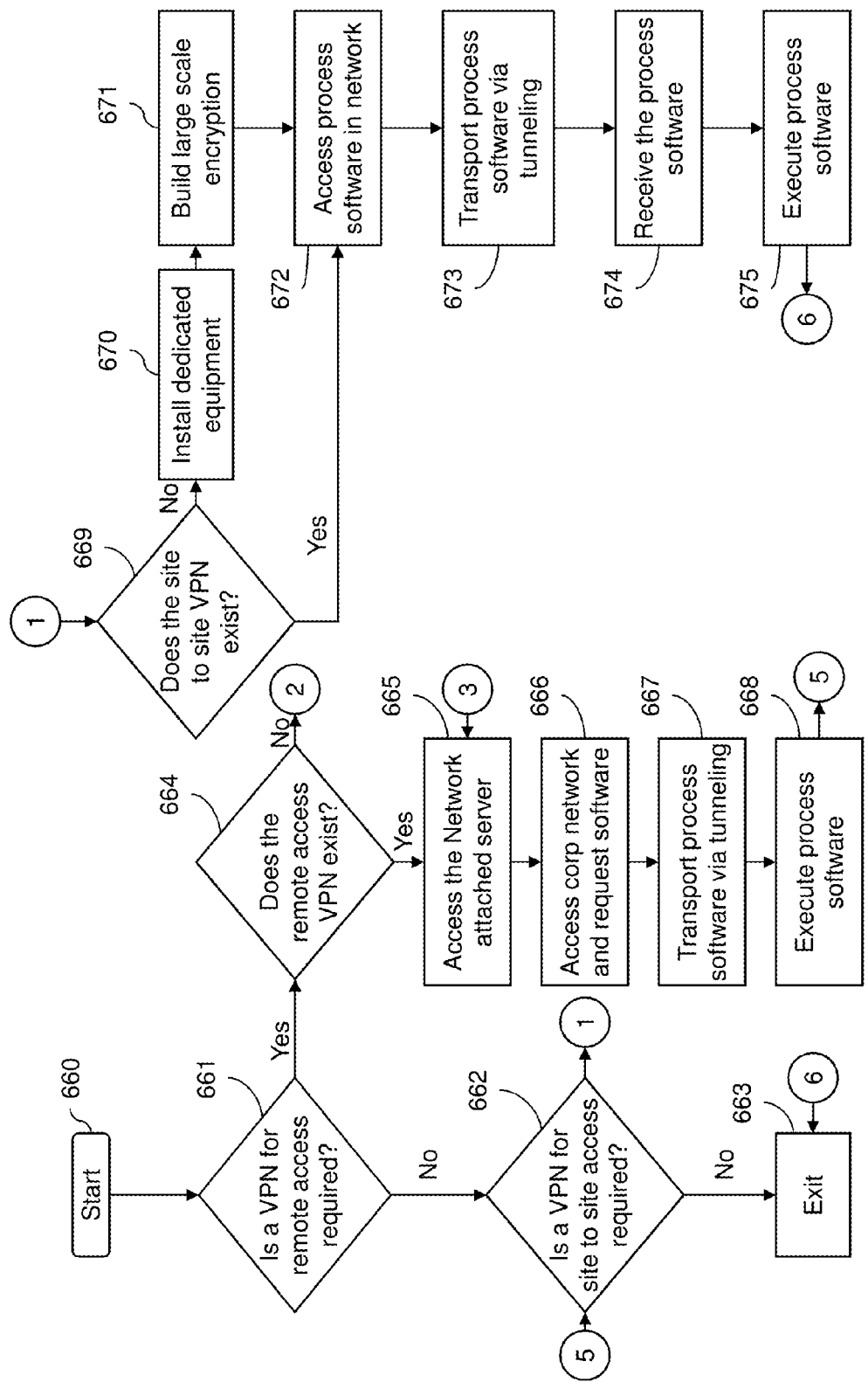
FIG. 15 is a schematic diagram of a virtual private network system according to embodiments herein.

In FIGS. 15 and 16, Step 660 begins the Virtual Private Network (VPN) process. A determination is made to see if a VPN for remote access is required 661. If it is not required, the method proceeds to 662. If it is required, the method determines if the remote access VPN exists 664.

If it does exist, the method then proceeds to 665. Otherwise, the method identifies the third party provider that will provide the secure, encrypted connections between the company's private network and the company's remote users 676. The company's remote users are identified 677. The third party provider then sets up a network access server (NAS)

678 that allows the remote users to dial a toll free number or attach directly via a cable or DSL modem to access, download, and install the desktop client software for the remote-access VPN 679.

After the remote access VPN has been built, or if it been previously installed, the remote users can then access the process software by dialing into the NAS or attaching directly via a cable or DSL modem into the NAS 665. This allows entry into the corporate network where the process software is accessed 666. The process software is transported to the remote users' desktop over the network via tunneling. That is, the process software is divided into packets and each packet, including the data and protocol, is placed within another packet 667. When the process software arrives at the remote users' desktop, it is removed from the packets, reconstituted, and then is executed on the remote users, desktop 668.

A determination is made to see if a VPN for site-to-site access is required 662. If it is not required, then proceed to exit the process 663. Otherwise, determine if the site-to-site VPN exists 669. If it does exist, then proceed to 672. Otherwise, install the dedicated equipment required to establish a site-to-site VPN 670. Then build the large-scale encryption into the VPN 671.

After the site-to-site VPN has been built, or if it had been previously established, the users access the process software via the VPN 672. The process software is transported to the site users over the network via tunneling 673. That is, the process software is divided into packets and each packet including the data and protocol is placed within another packet 674. When the process software arrives at the remote users' desktop, it is removed from the packets, reconstituted, and executed on the site users' desktop 675. Proceed to exit the process 663.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of sorting integrated circuit devices, said method comprising:
   manufacturing said integrated circuit devices on a wafer according to an integrated circuit design using manufacturing equipment, said integrated circuit design producing identically designed integrated circuit devices that perform differently based on manufacturing process variations, said identically designed integrated circuit devices being for use in a range of environmental conditions, to satisfy needs of different customers;
   performing testing on said identically designed integrated circuit devices using testing equipment to produce test results;
   individually predicting environmental maximums for each identically designed integrated circuit device of said identically designed integrated circuit devices using a computerized device operatively connected to said testing equipment, said environmental maximums corresponding to said environmental conditions that must not be exceeded for each said identically designed integrated circuit device to perform above a given failure rate;
   assigning each said identically designed integrated circuit device at least one grade based on said environmental maximums predicted for each said identically designed integrated circuit device, using said computerized device; and
   sorting each of said identically designed integrated circuit devices to satisfy needs of different customers, based on said at least one grade assigned to each said identically designed integrated circuit device, using said computerized device based on said predicted environmental maximums.

2. The method of claim 1, said environmental conditions comprising operating temperature, operating voltage, and power-on hours.

3. The method of claim 1, said assigning of said at least one grade being based on different combinations of said environmental conditions for each of said identically designed integrated circuit devices.

4. The method of claim 1, said testing comprising testing processing tool events, metrology parameters, electrical parameters, process limited yield (PLY) parameters, technology, and product qualification outcomes.

5. The method of claim 1, an interval of said testing including at least one of: during manufacturing, after manufacturing, and during packaging.

6. The method of claim 1, further comprising, adjusting an amount of burn-in for each of said identically designed integrated circuit devices based on said at least one grade of said identically designed integrated circuit devices.

7. A system for sorting integrated circuit devices for use in a range of environmental conditions, to satisfy needs of different customers, comprising:
   a processor; and
   a performance monitor operatively connected to said processor,
      said integrated circuit devices are manufactured on a wafer according to an integrated circuit design using manufacturing equipment, said integrated circuit design producing identically designed integrated circuit devices that perform differently based on manufacturing process variations, said identically designed integrated circuit devices being for use in a range of environmental conditions, to satisfy needs of different customers
      said performance monitor performing testing on said integrated circuit devices using testing equipment to produce test results,
      said processor individually predicting environmental maximums for each integrated circuit device, said environmental maximums comprising said environmental conditions that must not be exceeded for each said integrated circuit device to perform above a given failure rate, said processor assigning each said integrated circuit device at least one grade based on said environmental maximums predicted for each said integrated circuit device to satisfy said needs of different customers, and said processor sorting each of said identically designed integrated circuit devices to satisfy needs of different customers, based on said at least one grade assigned to each said identically designed integrated circuit device, using said computerized device based on said predicted environmental maximums.

8. The system of claim 7, said environmental conditions comprising operating temperature, operating voltage, and power-on hours.

9. The system of claim 7, said processor assigning of said at least one grade based on different combinations of said environmental conditions for each of said integrated circuit devices.

10. The system of claim 7, said testing comprising testing processing tool events, metrology parameters, electrical parameters, process limited yield (PLY) parameters, technology, and product qualification outcomes.

11. The system of claim 7, an interval of said testing including at least one of: during manufacturing, after manufacturing, and during packaging.

12. The system of claim 7, further comprising:
said processor adjusting an amount of burn-in for each of said integrated circuit devices based on said at least one grade of said integrated circuit devices.

13. The system of claim 7, further comprising a temperature sensor connected to said processor, said processor sensing a temperature of a digital circuit of said integrated circuit devices using said temperature sensor and identifying a reliability band for a temperature operating range of said digital circuit.

14. A non-transitory computer readable storage medium readable by a computerized device, said non-transitory computer readable storage medium storing instructions executable by said computerized device to perform a method of sorting integrated circuit devices, said method comprising:
manufacturing integrated circuit devices on a wafer according to an integrated circuit design using manufacturing equipment, said integrated circuit design producing identically designed integrated circuit devices that perform differently based on manufacturing process variations, said identically designed integrated circuit devices being for use in a range of environmental conditions, to satisfy needs of different customers;
performing testing on said identically designed integrated circuit devices using testing equipment to produce test results;
individually predicting environmental maximums for each identically designed integrated circuit device of said identically designed integrated circuit devices, said environmental maximums corresponding to said environmental conditions that must not be exceeded for each said identically designed integrated circuit device to perform above a given failure rate;
assigning each said identically designed integrated circuit device at least one grade based on said environmental maximums predicted for each said identically designed integrated circuit device; and
sorting each of said identically designed integrated circuit devices to satisfy needs of different customers having different environmental conditions based on said at least one grade assigned to each said identically designed integrated circuit device based on said predicted environmental maximums.

15. The non-transitory computer readable storage medium of claim 14, said environmental conditions comprising operating temperature, operating voltage, and power-on hours.

16. The non-transitory computer readable storage medium of claim 14, said assigning of said at least one grade being based on different combinations of said environmental conditions for each of said identically designed integrated circuit devices.

17. The non-transitory computer readable storage medium of claim 14, said testing comprising testing processing tool events, metrology parameters, electrical parameters, process limited yield (PLY) parameters, technology, and product qualification outcomes.

18. The non-transitory computer readable storage medium of claim 14, an interval of said testing including at least one of: during manufacturing, after manufacturing, and during packaging.

19. The non-transitory computer readable storage medium of claim 14, further comprising, adjusting an amount of burn-in for each of said identically designed integrated circuit devices based on said at least one grade of said identically designed integrated circuit devices.

* * * * *